(12) United States Patent
Chen et al.

(10) Patent No.: US 9,244,118 B2
(45) Date of Patent: Jan. 26, 2016

(54) TESTING SYSTEM WITH AN ISOLATED SWITCHING MODULE

(71) Applicants: Ching-Tsung Chen, New Taipei (TW); Weichung Chen, New Taipei (TW)

(72) Inventors: Ching-Tsung Chen, New Taipei (TW); Weichung Chen, New Taipei (TW)

(73) Assignees: Global Unichip Corp., Hsinchu (TW); Taiwan Semiconductor Manufacturing Company Ltd., Hsinchu (TW)

( * ) Notice: Subject to any disclaimer, the term of this patent is extended or adjusted under 35 U.S.C. 154(b) by 369 days.

(21) Appl. No.: 13/731,012

(22) Filed: Dec. 30, 2012

(65) Prior Publication Data

US 2014/0184240 A1    Jul. 3, 2014

(51) Int. Cl.
*H01H 31/02* (2006.01)
*G01R 31/28* (2006.01)
*G01R 31/319* (2006.01)

(52) U.S. Cl.
CPC ...... *G01R 31/2889* (2013.01); *G01R 31/31926* (2013.01); *H01L 2221/00* (2013.01); *H04B 2203/00* (2013.01); *H04B 2215/00* (2013.01)

(58) Field of Classification Search
CPC ......... G01R 1/00; G06F 1/00; G06F 2101/00; G06F 2200/00; G06F 2201/00; G09G 1/00; G09G 2230/00; G09G 2290/00; H01L 21/00; H01L 2221/00; H01L 2223/00; H01L 2224/00; H01L 2225/00; H04B 1/00; H04B 2201/00; H04B 2203/00
USPC ....................................................... 324/555
See application file for complete search history.

(56) References Cited

U.S. PATENT DOCUMENTS

| | | | | |
|---|---|---|---|---|
| 3,562,644 A * | 2/1971 | DeWolf | ............... | G01R 31/316 714/738 |
| 4,085,361 A * | 4/1978 | Bathiany | ................ | G01R 27/28 324/604 |
| 5,254,942 A * | 10/1993 | D'Souza et al. | ............. | 714/727 |
| 5,506,510 A * | 4/1996 | Blumenau | ................ | 324/754.11 |
| 5,821,529 A * | 10/1998 | Chihara et al. | ............. | 250/214.1 |
| 6,051,985 A * | 4/2000 | Kropuenske | ........... | H04N 17/04 315/408 |
| 6,268,735 B1 * | 7/2001 | Craig et al. | ................... | 324/603 |
| 7,940,058 B2 * | 5/2011 | Newton | ............... | G01R 31/028 324/548 |
| 2002/0121885 A1 * | 9/2002 | Taylor | .................... | G05F 1/461 323/280 |
| 2005/0137814 A1 * | 6/2005 | Kelly | .................... | G01R 29/26 702/69 |

\* cited by examiner

*Primary Examiner* — Huy Q Phan
*Assistant Examiner* — Temilade Rhodes-Vivour
(74) *Attorney, Agent, or Firm* — Min-Lee Teng; Litron Patent & Trademark Office

(57) ABSTRACT

In this invention, a test system includes a tester and a switching module for connecting any pin to the tester for testing a device-under-test (DUT), the test system has a rectifying device between the ground of the DUT and the ground of the switching module in order to isolate the DUT from the switching module, thereby blocking unwanted current flowing between the DUT and the switching module to ensure the correctness of the testing.
Since the ground of the switching module is not directly connected to the ground of the DUT and the tester, the rectifying device will keep the voltage difference between the ground of the switching module and the DUT in a range between zero and the cut-in voltage of the rectifying device, thereby allowing single-ended signals to be used between the switching module and the tester or the DUT.

19 Claims, 3 Drawing Sheets

TESTING SYSTEM WITH AN ISOLATED SWITCHING MODULE

BACKGROUND OF THE INVENTION

1. Field of the Invention

The invention relates in general to a testing system for testing a device, and more particular to a testing system with a switching module for testing a device.

2. Description of the Prior Art

A device such as IC (Integrated Circuit) is required to be fully tested before it can be released to the market. Nowadays, IC has become more and more complicated with ever increasing running speed. As a result, how to test an IC to ensure it is fully functioning is an important task, especially for high speed and high pin-count devices.

For a high pin-count IC, it is preferred to use a solid state switching module instead of using relays to select any pins out of all the pins of an IC for testing, because the size of the solid state switching module can be made much smaller compared with conventional relays. However, in solid state switching module, it is easier to conduct current from the switching module back to the DUT (Device Under Test) or the tester, which will affect the correctness of the testing results.

For example, FIG. 1 illustrates a conventional testing system, which includes a DUT 100, a switching module 101 and a tester 102. The DUT 100, the switching module 101 and the tester 102 are grounded together. The DUT 100 has a plurality of I/O pins. The switching module 101 comprises a conductive path 103 to conduct a first pin out of the plurality of I/O pins to a second pin of the switching module. The tester is connected to the conductive path 103. An open/short test is performed by forcing current from the conductive path 103 to the tester 102. In such conventional testing system, there may be a current path 104 that allows a current $I_{SW}$ (110) flowing from the ground of the switching module to the second pin in the switching module. As a consequence, a current seen by the tester $I_{TESTER}$ (120) is the sum of $I_{SW}$ (110) and current loop $I_{DUT}$ (130) through the conductive path 103, which can be shown in the following equation:

$$I_{TESTER} = I_{DUT} + I_{SW},$$

Wherein the $I_{DUT}$ (130) is what a designer cares about and the $I_{SW}$ (110) shall not exist in the open/short test in the first place; otherwise, a pseudo pass will occur in the open/short test because the current flowing from the switching module back to the tester will reduce the current from the DUT back to the tester, which will cause the test to fail.

Furthermore, some unwanted current flowing from the switching modules to the DUT or the tester may take different ways. For instance, in a solid state high speed switching module, parasitic inductance or capacitance may contribute current flowing between the switching module and the DUT or tester due to sudden current changes if all the grounds of the DUT, switching module, and the tester are tied together.

Therefore, what is needed is a solution to perform tests on a DUT to resolve the pseudo pass issue.

SUMMARY OF THE INVENTION

One of the objective of present invention is to provide a testing system with a switching module for connecting any pin to the tester for testing; the test system has a rectifying device between the ground of the DUT and the ground of the switching module in order to isolate, and block unwanted current flowing between, the DUT and the switching module to ensure the correctness of the testing.

One embodiment discloses a system for testing a DUT having a first ground and a plurality of I/O pins, comprising: a switching module, which has a second ground and is configured to setup a conductive path to conduct a first pin out of the plurality of I/O pins to a second pin of the switching module; a tester, which has a third ground and is connected to the conductive path; and a first rectifying device having a first positive terminal and a first negative terminal, wherein the first ground of the DUT and the third ground of the tester are electrically coupled to each other; and the first positive terminal is electrically coupled to the third ground of the tester, and the first negative terminal is electrically coupled to the first ground of the DUT.

One embodiment describes the above-mentioned system for testing the DUT, further comprising a second rectifying device inserted between the first pin and the ground of the DUT for protecting the first pin, wherein the second rectifying device is tested by forcing current from a conductive path to the tester and measuring the voltage between the conductive path and the third ground.

One embodiment describes the above-mentioned system for testing the DUT, further comprising a switching device having a first terminal, a second terminal and a third terminal, wherein the first terminal of the switching device is coupled to the second ground, the second terminal of the switching device is coupled to the first ground and the third terminal of the switching device is coupled to the third positive terminal.

One embodiment describes the above-mentioned system for testing the DUT, further comprising a memory device connected to the DUT for performing functional test of the DUT, the system can perform both functional test and continuing test to make sure the DUT is fully tested correctly.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF THE INVENTION

The detailed explanation of the present invention is described as following. The described preferred embodiments are presented for purposes of illustrations and description, and they are not intended to limit the scope of the present invention.

Figure 1:
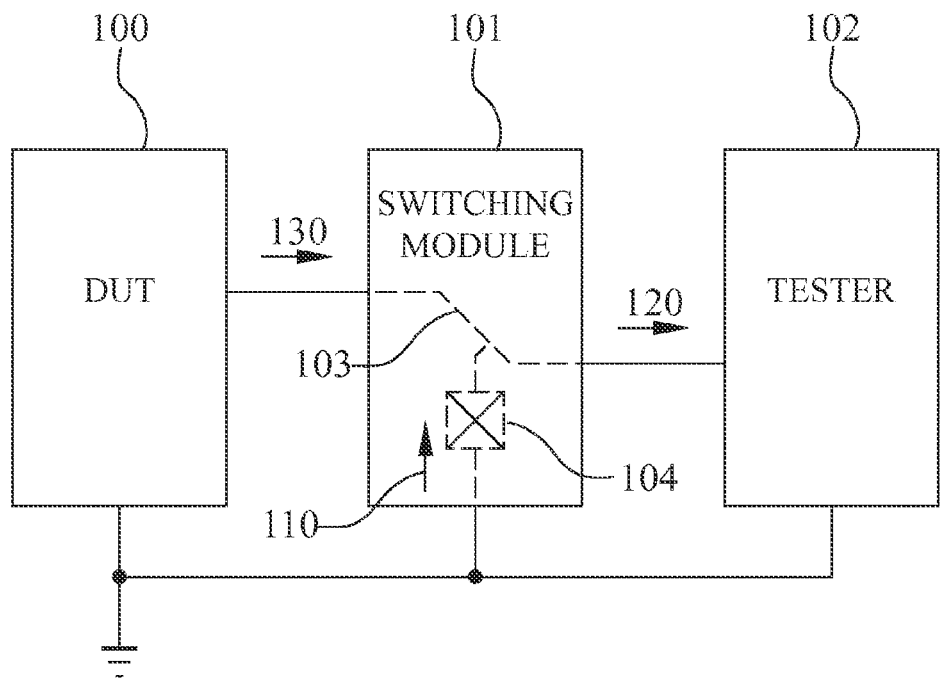
FIG. 1 illustrates a conventional testing system, which includes a device under test, a switching module and a tester.
Figure 2:
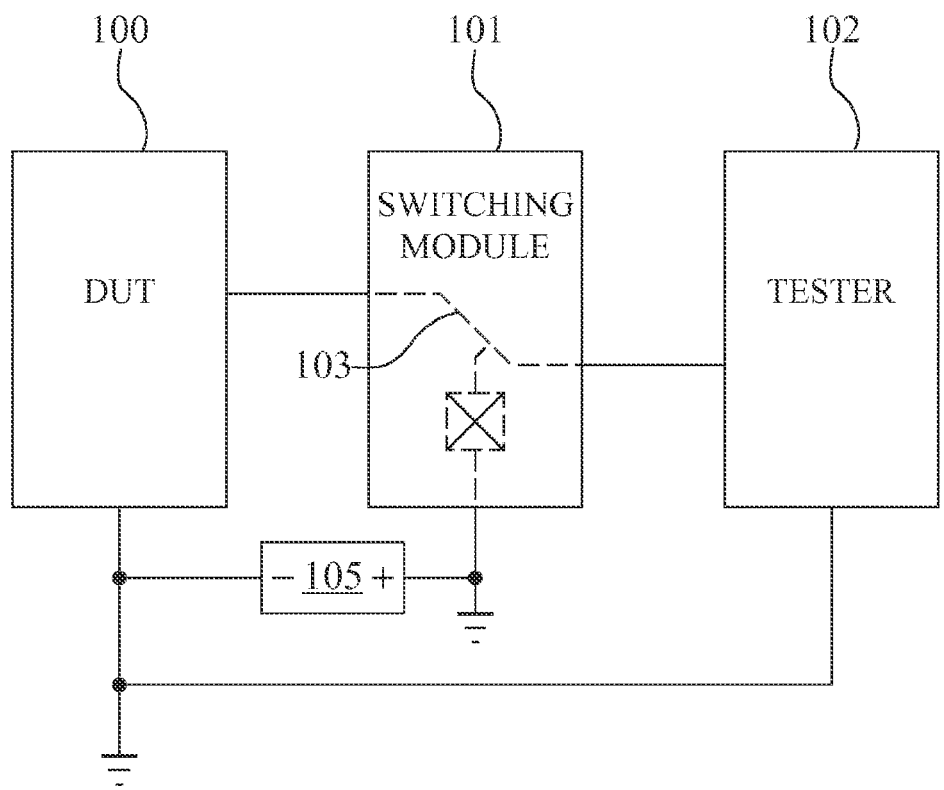
FIG. 2 illustrates a testing system in accordance with present invention, which includes a device under test, a switching module and a tester.

FIG. 2 illustrates one embodiment of the invention. The ground of a tester 102 is connected to the ground of a DUT 100 and a switching module 101 has its own ground. A rectifying device 105 is inserted between the ground of the switching module and the ground of DUT. In this configuration, the current will only be allowed from positive terminal to the negative terminal, that is, from the ground of the switching module to the ground of the DUT.

During an open/short test, normally the DUT 100 is not powered on in order to perform the test, and the switching module 101 has its own power source. The rectifying device 105 has a positive and a negative terminal, and the current will flow from the positive terminal to the negative terminal when a voltage between the positive terminal and the negative terminal is higher than the cut-in voltage of the rectifying device. However, if the rectifying device 105 is forward biased with a voltage higher than zero but less than the cut-in voltage, there is no current flow from positive terminal to the negative terminal, but the biased voltage will be between zero and the cut-in voltage. Since the ground of the switching module 101 is not directly connect to the ground of the DUT 100 and the tester 102, the rectifying device 105 will keep the voltage difference between the ground of the switching module 101 and the ground of the DUT 100 in a range between zero and the cut-in voltage of the rectifying device. For example, if the rectifying device 105 is a Schottky diode with a cut-in voltage 0.2V, the voltage difference between the ground of the switching module 101 and the ground of the DUT 100 will be kept between zero and 0.2V, that is, at most 0.2V, which is tolerable for the system to function. Furthermore, some unwanted current flowing from the switching module 101 to the DUT 100 or the tester 102 may take different ways. For instance, the switching module 101 is a solid state high speed switching module.

Undesired current flowing from the switching module 101 to the DUT 100 or the tester 102, due to a current path from the second pin 109 to the ground of the switching module 101 through some parasitic inductance or capacitance in the switching module 101, can be reduced or blocked by the rectifying device 105 as well.

By using a rectifying device between the ground of the switching module and the ground of a DUT, the switching module and the DUT can be isolated, while the voltage difference between the ground of the switching module and the ground of the DUT can be kept small so as to allow single-ended signals to be used between the switching module and the tester or the DUT. For example, some switching control signals can be provided for the switching module to control the switching or multiplexing the I/O pins of the DUT to the tester, wherein the switching control signals are single ended to save cost.

The tester is connected to a conductive path 103 in the switching module 101. An open/short test is performed by forcing current from the conductive path to the tester. In this configuration, the current will flow from the DUT to the tester but the current will not flow from the switching module to the tester, because the rectifying device will not conduct the current in reverse direction from negative terminal to the positive terminal under normal working condition. As a result, the current will flow only from the DUT to the tester, that is, $$I_{TESTER} = I_{DUT},$$

and the pseudo pass issue is resolved.

Figure 3:
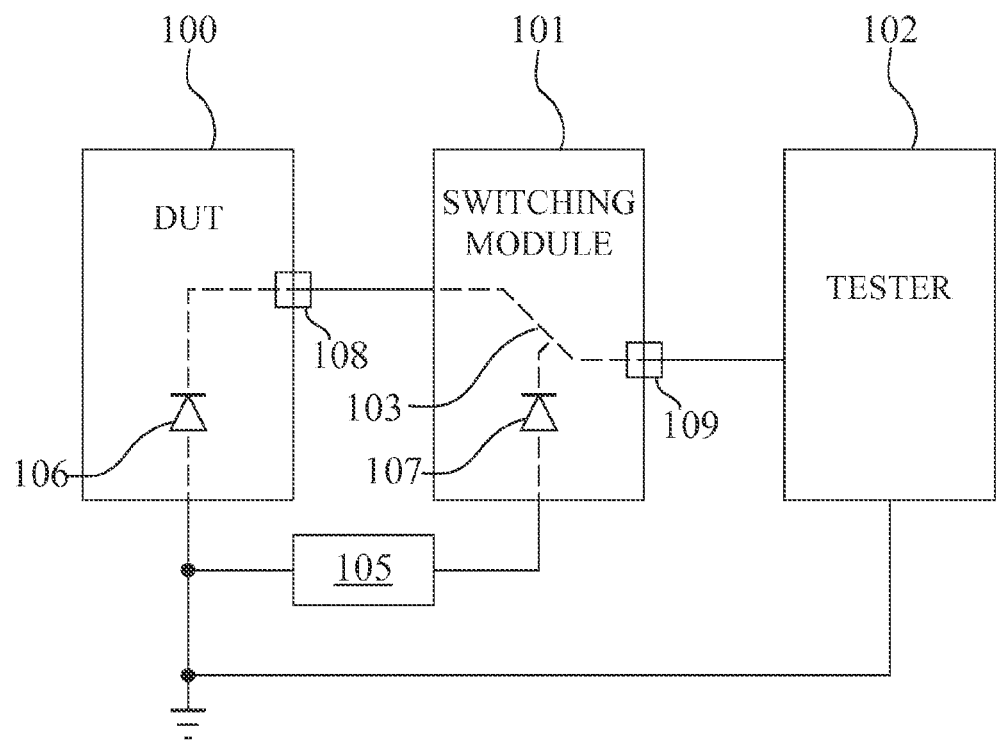
FIG. 3 illustrates a testing system in one embodiment in accordance with present invention, which includes a device under test, a switching module and a tester and a conductive path for testing the DUT.

FIG. 3 illustrates a testing environment in which a first diode 106 is connected to a first pin 108 and the ground of the DUT; and a second diode 107 is connected to a second pin 109 and the ground of the switching module. The diodes are typically connected to a pin for surge protection in case the voltage at the first or the second pin exceeding a rated voltage, such as −1V. In such case, the first or the second pin will be forced to ground because the first or the second diode will be turned on by the surge to allow the first pin or the second pin conducting to the ground to protect the DUT or the switching module.

The rectifying device 105, such as vacuum tube diode or solid-state diode, is located between the ground of the switching module and the ground of the DUT, with a positive terminal connected to the switching module and a negative terminal connected to the ground of the DUT. A conductive path 103 from the first pin 108 to the second pin 109 will be setup by the switching module 101; and the tester 102 is connected to the conductive path 103 in order to test the first pin of the DUT.

After the conductive path 103 is setup, an open/short test is performed by forcing current from the conductive path 103 to the tester 102, and then the voltage between the conductive path 103 and the ground of the DUT 100 is measured to determine if the first diode 106 connecting to the first pin 108 of the DUT 100 pass the test or not. In this configuration, the current will flow from the DUT 100 to the tester 102 but the current will not flow from the ground of the DUT 100, via the ground of the switching module 101, back to the tester 102 because the rectifying device 105 will not conduct the current in reverse direction from negative terminal to the positive terminal. On the contrary, if the rectifying device is not inserted between the ground of the switching module and the ground of the DUT, then the current will flow from the switching ground to the tester through the second diode, which will cause the open/short test to fail due to the fact that the current flowing from the DUT to the tester is less than the current forced by the tester.

Please note that instead of forcing current from the tester, a voltage source can be used to force a voltage on the conductive path 103, and the current flowing into the tester can be measured to determine if the first diode connecting to the first pin in the DUT pass the test or not as well.

Figure 4:
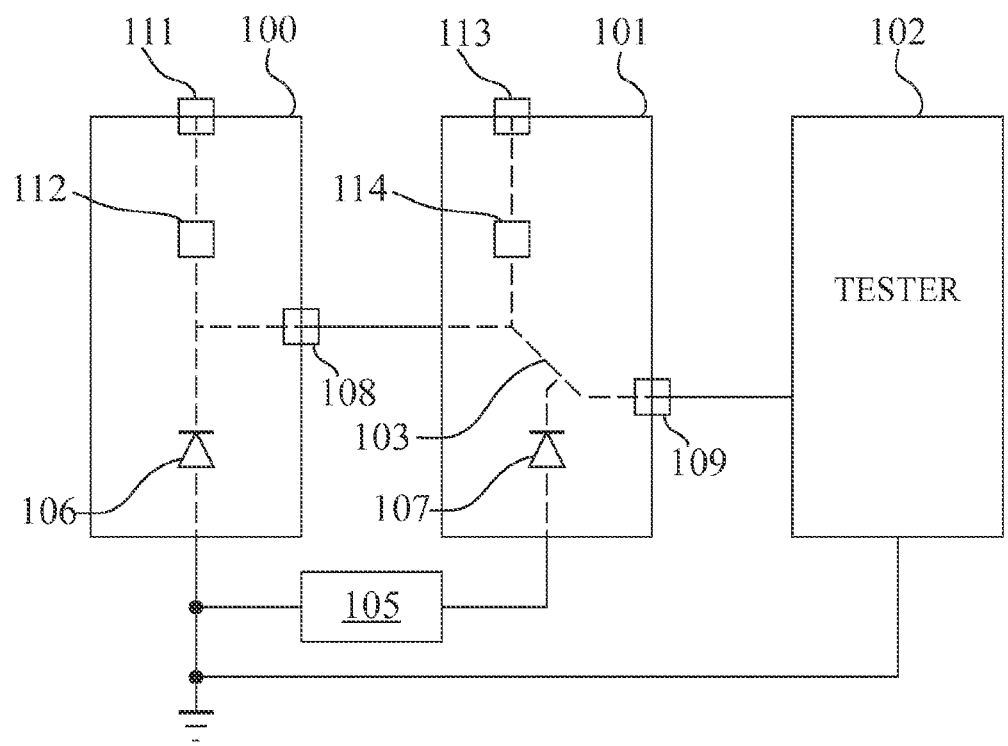
FIG. 4 illustrates a testing system in one embodiment in accordance with present invention, which further comprises rectifying devices connecting to the pins of DUT and switching module and power sources.

Please refer to FIG. 4 which illustrates a testing environment in which there are a first diode 106 connected to a first pin 108 and the ground of the DUT 100, a second diode 107 connected to a second pin 109 and the ground of the switching module, a third pin 111 of the DUT and a fourth rectifying device 112 having a fourth positive terminal and a fourth negative terminal, wherein the fourth positive terminal is coupled to the first pin and the fourth negative terminal is coupled to third pin 111 of the DUT 100. In addition, it includes a fifth pin 113 of the switching module 101 and a fifth rectifying device 114 having a fifth positive terminal and a fifth negative terminal, wherein the fifth positive terminal is coupled to the second pin 109 of the switching module 101 and the fifth negative terminal is coupled to fifth pin 113 of the switching module 101.

The conductive path 103 from the first pin 108, via the second pin 109, to the tester 102 will be setup by the switching module 101. The tester 102 is connected to the conductive path 103 in order to test the first pin 108 of the DUT 100. An open/short test is performed by forcing current from the conductive path 103 to the tester 102, and then the voltage between the conductive path 103 and the ground of the DUT 100 is measured to determine if the first diode 106 connecting to the first pin 108 in the DUT 100 pass the test or not. In this configuration, the current will flow from the DUT 100 to the tester 103 but the current will not flow from the ground, via the switching module 101, to the tester 102 because the rectifying device 105 will not conduct the current in reverse direction from negative terminal to the positive terminal.

Please note that in this configuration, the fourth and fifth diodes will not conduct in this test because the voltage at the first pin and the second pin is negative, therefore the fourth and fifth diodes are reversed biased.

Figure 5:
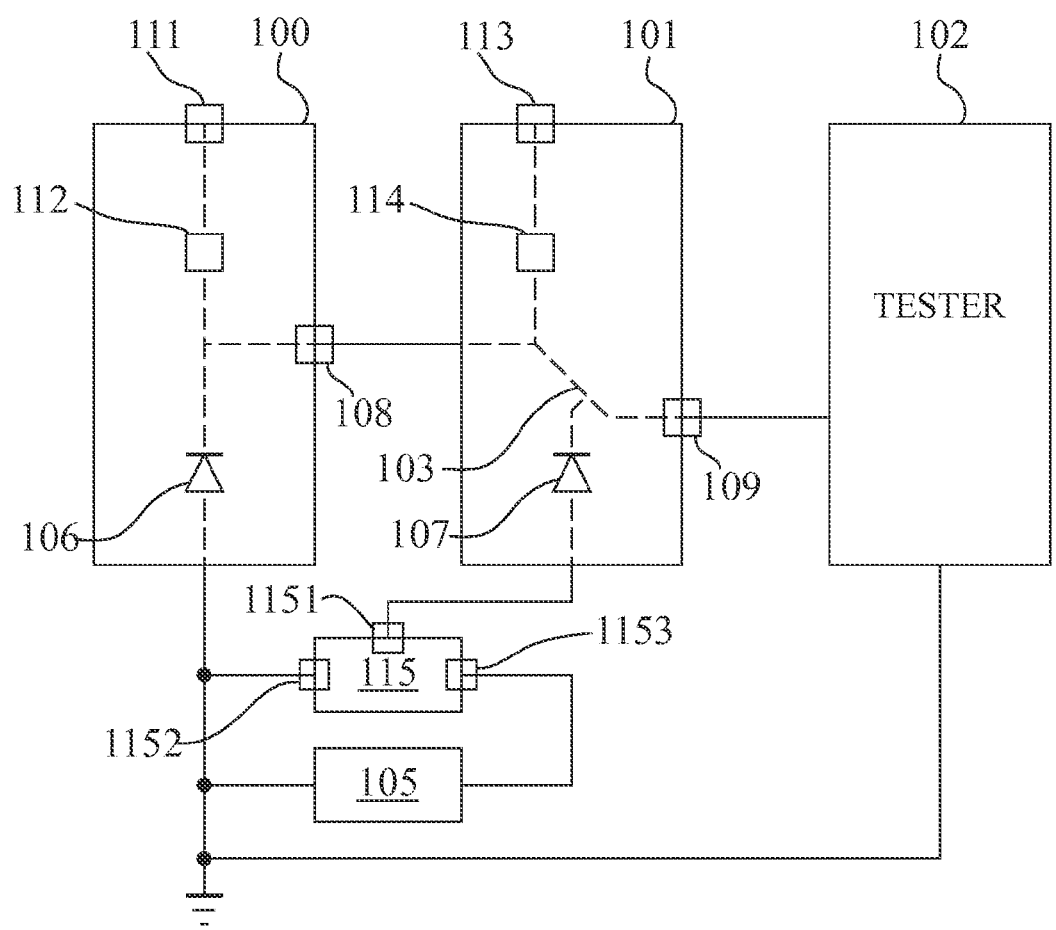
FIG. 5 illustrates a testing system in one embodiment in accordance with present invention, which further comprises a switching device to switch the ground of the switching module between the ground of the DUT and the rectifying device.

Please refer to FIG. 5 which illustrates a testing environment in which there are a first diode 106 connected to a first pin 108 and the ground of the DUT 100, a second diode 107 connected to a second pin 109 and the ground of the switching module 101, a third pin 111 of the DUT 100 and a fourth rectifying device 112 having a fourth positive terminal and a fourth negative terminal, wherein the fourth positive terminal is coupled to the first pin 108 and the fourth negative terminal is coupled to third pin 111 of the DUT 100. In addition, it includes a fifth pin 113 of the switching module 101 and a fifth rectifying device 114 having a fifth positive terminal and a fifth negative terminal, wherein the fifth positive terminal is coupled to the second pin 109 of the switching module 101 and the fifth negative terminal is coupled to fifth pin 113 of the switching module 101. Furthermore, the system further includes a switching device 115 having a first terminal 1151, a second terminal 1152 and a third terminal 1153, wherein the first terminal of the switching device is coupled to the second ground, the second terminal of the switching device is coupled to the first ground and the third terminal of the switching device is coupled to the positive terminal of the rectifying device 105. The switching device 115 can be a relay device. When the system is performing the open/short test as described above, the relay device connects the ground of the switching module 101 to the rectifying device 105; otherwise, the relay device will connect the ground of the switching module 101 to the ground of the DUT 100 for performing functional testing. In such configuration, the system can be setup in two ways to perform either the open/short test or the functional test.

During an open/short test, the relay device connects the ground of the switching module 101 to the rectifying device and a conductive path 103 from the first pin 108 to the second pin 109 and to the tester 102 will be setup by the switching module 101. The tester 102 is connected to the conductive path 103 in order to test the first pin 108 of the DUT 100. The open/short test is performed by forcing current from the conductive path 103 to the tester 102, and then the voltage between the conductive path 103 and the ground of the DUT 100 is measured to determine if the first diode 106 connecting to the first pin 108 in the DUT 100 pass the test or not. In this configuration, the current will flow from the DUT 100 to the tester 102 but the current will not flow from the ground, via the switching module 101, to the tester 102 because the rectifying device will not conduct the current in reverse direction from negative terminal to the positive terminal.

During a functional test, the relay device can connect the ground of the switching module 101 to the ground of the DUT 100 for performing functional testing if desired. In one embodiment, the DUT can be connected to a memory device for performing a functional test on DUT.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A system for testing a DUT having a first ground and a plurality of I/O pins, comprising:
a switching module having a second ground, comprising a conductive path configured to conduct a first pin out of the plurality of I/O pins of the DUT to a second pin of the switching module;
a tester having a third ground, connected to the conductive path;
a first rectifying device having a first positive terminal and a first negative terminal;
a second rectifying device having a second positive terminal and a second negative terminal, wherein the second positive terminal is electrically coupled to the first ground of the DUT; and the second negative terminal is electrically coupled to the first pin of the DUT; and
a third rectifying device having a third positive terminal and a third negative terminal, wherein the third positive terminal is electrically coupled to the second ground of the switching module; and the third negative terminal is electrically coupled to the second pin of the switching module,
wherein the first ground of the DUT and the third ground of the tester are electrically coupled to each other; the first positive terminal of the first rectifying device is electrically coupled to the second ground of the switching module; and the first negative terminal of the first rectifying device is electrically coupled to the first ground of the DUT, wherein the first ground of the DUT and the second ground of the switching module are separated by the first rectifying device.

2. The claim according to claim 1, further comprising:
a third pin of the DUT; and
a fourth rectifying device having a fourth positive terminal and a fourth negative terminal, wherein the fourth positive terminal is electrically coupled to the first pin of the DUT; and the fourth negative terminal is electrically coupled to the third pin of the DUT.

3. The claim according to claim 2, further comprising:
a fifth pin of the switching module; and
a fifth rectifying device having a fifth positive terminal and a fifth negative terminal, wherein the fifth positive terminal is electrically coupled to the second pin of the switching module; and the fifth negative terminal is electrically coupled to the fifth pin of the switching module.

4. The claim according to claim 1, wherein the first rectifying device is a diode.

5. The claim according to claim 1, wherein the first rectifying device is a Schottky diode.

6. The claim according to claim 1, wherein the second rectifying device is tested by forcing a current from the conductive path to the tester and measuring the voltage between the conductive path and the third ground of the tester.

7. The claim according to claim 1, wherein the second rectifying device is tested by forcing a voltage between the conductive path and the third ground of the tester and measuring the current from the conductive path to the tester.

8. The claim according to claim 2, wherein the second rectifying device is tested by forcing a current from the conductive path to the tester and measuring the voltage between the conductive path and the third ground of the tester.

9. The claim according to claim 2, wherein the second rectifying device is tested by forcing a voltage between the conductive path and the third ground of the tester and measuring the current from the conductive path to the tester.

10. The claim according to claim 1, wherein the second rectifying device is a diode.

11. The claim according to claim 1, wherein the third rectifying device is a diode.

12. The claim according to claim 3, wherein the second rectifying device is tested by forcing a current from the conductive path to the tester and measuring the voltage between the conductive path and the third ground of the tester.

13. The claim according to claim 3, wherein the second rectifying device is tested by forcing a voltage between the conductive path and the third ground of the tester and measuring the current from the conductive path to the tester.

14. The claim according to claim 3, further comprising a switching device having a first terminal, a second terminal and a third terminal, wherein the first terminal of the switching device is electrically coupled to the second ground of the switching module; the second terminal of the switching device is electrically coupled to the first ground of the DUT; and the third terminal of the switching device is electrically coupled to the first positive terminal of the first rectifying device.

15. The claim according to claim 14, wherein the switching device is a relay device.

16. The claim according to claim 15, wherein the first terminal of the relay device is connected to the third terminal of the switching device, wherein the second rectifying device is tested by forcing a current from the conductive path to the tester and measuring the voltage between the conductive path and the third ground.

17. The claim according to claim 15, wherein the first terminal of the relay device is connected to the third terminal of the switching device, wherein the second rectifying device is tested by forcing a voltage between the conductive path and the third ground and measuring the current from the conductive path to the tester.

18. The claim according to claim 15, wherein the first terminal of the relay device is connected to the second terminal of the switching device, wherein a functional test is performed on the DUT.

19. The claim according to claim 15, wherein the first terminal of the relay device is connected to the second terminal of the switching device, wherein the DUT is connected to a memory device, wherein a functional test is performed on the DUT.

* * * * *